(12) United States Patent
Shapiro et al.

(10) Patent No.: US 10,004,154 B1
(45) Date of Patent: *Jun. 19, 2018

(54) DUST GUARD STRUCTURE

(71) Applicant: International Business Machines Corporation, Armonk, NY (US)

(72) Inventors: Michael J. Shapiro, Austin, TX (US); Brian C. Twichell, Austin, TX (US); Brent W. Yardley, Hillsboro, OR (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/722,030

(22) Filed: Oct. 2, 2017

Related U.S. Application Data

(63) Continuation of application No. 15/436,061, filed on Feb. 17, 2017.

(51) Int. Cl.
*H05K 5/02* (2006.01)
*H05K 1/11* (2006.01)
*H05K 1/18* (2006.01)

(52) U.S. Cl.
CPC ............ *H05K 5/0217* (2013.01); *H05K 1/11* (2013.01); *H05K 1/181* (2013.01); *H05K 2201/07* (2013.01); *H05K 2201/10371* (2013.01)

(58) Field of Classification Search
CPC .................................................. H05K 7/142
USPC ......................................................... 361/752
See application file for complete search history.

(56) References Cited

U.S. PATENT DOCUMENTS

| | | | |
|---|---|---|---|
| 3,544,857 | A | 12/1970 | Byrne et al. |
| 4,386,388 | A | 5/1983 | Beun |
| 5,277,972 | A | 1/1994 | Sakumoto et al. |
| 5,304,419 | A | 4/1994 | Shores |
| 5,811,184 | A | 9/1998 | Anderson et al. |
| 5,838,495 | A | 11/1998 | Hennick |
| 6,551,525 | B2 | 4/2003 | Hofmann et al. |
| 6,989,049 | B2 | 1/2006 | Belson et al. |

(Continued)

FOREIGN PATENT DOCUMENTS

| | | |
|---|---|---|
| CN | 2836414 Y | 11/2006 |
| CN | 101505577 A | 8/2009 |

(Continued)

OTHER PUBLICATIONS

IBM, List of IBM Patents or Patent Applications Treated as Related, Appendix P, dated Oct. 3117, 2 pages.

(Continued)

*Primary Examiner* — Hoa C Nguyen
*Assistant Examiner* — Stanley Tso
(74) *Attorney, Agent, or Firm* — Tihon Poltavets

(57) ABSTRACT

An apparatus for a dust guard structure includes a particle guard coupled to a top surface of a circuit board, wherein the particle guard is located along a first side of the circuit board between an edge of the circuit board and a first electronic component. The dust guard structure further includes the first electronic component electrically coupled to the circuit board via one or more electronic connections, wherein a height of the particle guard is greater than a height of each of the one or more electrical connections of the first electronic component. The dust guard structure further includes the first side of the circuit board being introduced to an external airflow.

1 Claim, 5 Drawing Sheets

(56) References Cited

U.S. PATENT DOCUMENTS

| | | | |
|---|---|---|---|
| 7,113,402 | B2 | 9/2006 | Rutledge et al. |
| 7,473,301 | B2 | 1/2009 | Klebanoff et al. |
| 7,806,344 | B2 | 10/2010 | Chang |
| 8,256,495 | B2 | 9/2012 | Hattori et al. |
| 8,599,558 | B2 | 12/2013 | Kobayashi et al. |
| 9,387,647 | B2 | 7/2016 | Wei et al. |
| 2012/0014807 | A1* | 1/2012 | Liang .................. F04D 29/703 416/247 R |
| 2012/0118327 | A1 | 5/2012 | Mazmanyan |
| 2015/0138669 | A1* | 5/2015 | Kudo .................... G11B 5/483 360/99.08 |
| 2015/0159534 | A1 | 6/2015 | Godley |
| 2016/0267927 | A1* | 9/2016 | Kikuchi ............... G11B 5/4853 |
| 2016/0356656 | A1* | 12/2016 | Hoshika ................ G01K 13/02 |

FOREIGN PATENT DOCUMENTS

| | | |
|---|---|---|
| CN | 201383898 Y | 1/2010 |
| CN | 102238821 A | 11/2011 |
| CN | 203352938 U | 12/2013 |
| CN | 204790827 U | 11/2015 |
| CN | 106944377 A | 7/2017 |

OTHER PUBLICATIONS

Pending U.S. Appl. No. 15/436,061, filed Feb. 17, 2017, entitled: "Dust Guard Structure ", 21 pages.

\* cited by examiner

DUST GUARD STRUCTURE

FIELD OF THE INVENTION

This disclosure relates generally to dust guard structures, and in particular, to dust guard structures mounted on circuit boards.

BACKGROUND OF THE INVENTION

Computer cooling is the removal of waste heat produced by computer components located in computer systems, such as servers, where computer cooling allows for the computer components to operate within a permissible temperature range. Computer components that are susceptible to temporary malfunction or permanent damage due to overheating include integrated circuits such as computer processing units (CPUs), chipset, graphic cards, and hard disk drives. Air-cooling of the computer components typically includes the usage of cooling fans that aid in the removal of heat from enclosures housing the computer components. Air is introduced on the inlet side of the enclosure housing the computer components and exhausted from the outlet side of the enclosure. The introduction of the air on the inlet side typically includes dust particles and other contaminates, which are passed into the enclosure housing the computer components.

SUMMARY

An embodiment of the present invention discloses an apparatus for a dust guard structure comprising a particle guard coupled to a top surface of a circuit board, wherein the particle guard is located along a first side of the circuit board between an edge of the circuit board and a first electronic component; the first electronic component electrically coupled to the circuit board via one or more electronic connections, wherein a height of the particle guard is greater than a height of each of the one or more electrical connections of the first electronic component; and wherein the first side of the circuit board is introduced to an external airflow.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

Figure 1:
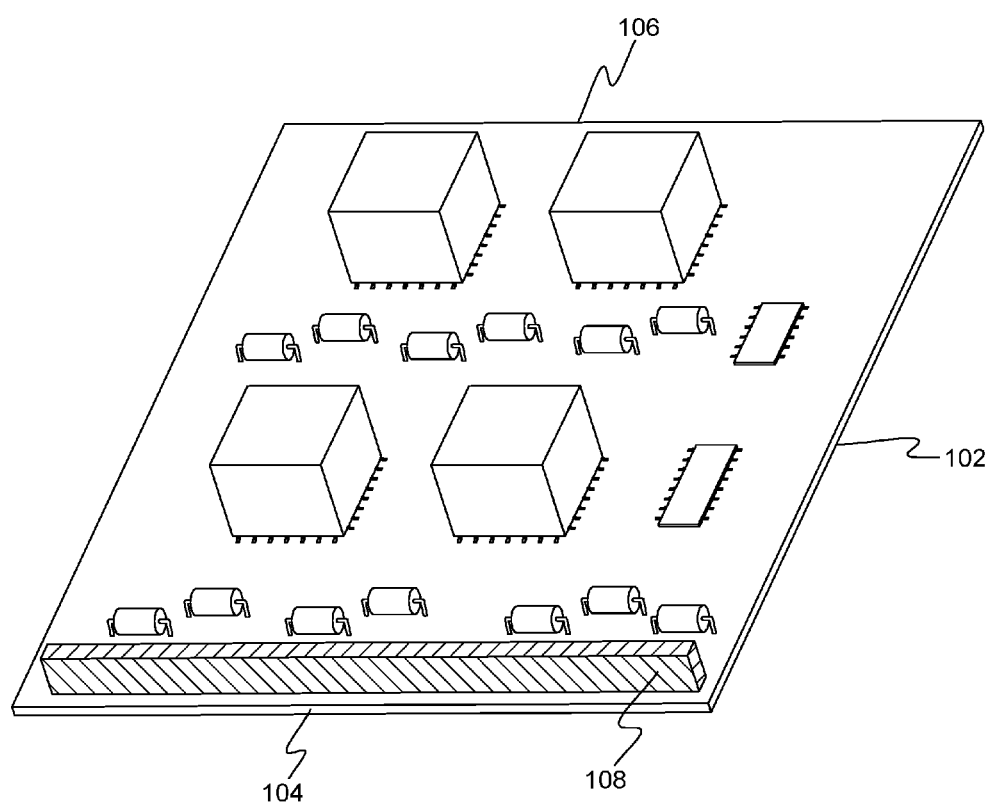
FIG. 1 depicts a circuit board with dust guard structure, in accordance with an embodiment of the present invention.

FIG. 1 depicts a circuit board with dust guard structure, in accordance with an embodiment of the present invention.

In this embodiment, circuit board 102 includes inlet side 104 and outlet side 106. Inlet side 104 of circuit board 102 represents a front side of circuit board 102, where cooling air is introduced (i.e., exposed) to circuit board 102. Outlet side 106 represents a rear side of circuit board 102, where the cooling air is exhausted away from circuit board 102. Dust guard 108 is coupled to circuit board 102 on inlet side 104, where airflow rate is greater when compared to outlet side 106. As a result of the cooling air being introduced to circuit board 102, ambient temperatures are lower and relative humidity levels are higher on inlet side 104 when compared to outlet side 106. Dust guard 108, also referred to as a particle guard in some embodiments, prevents contaminants from being passed over electronic components located near inlet side 104 on circuit board 108. By preventing contaminants from passing over the electronic components on circuit board 106, the electronic components are exposed to less containments that can build up around each of the electronic components resulting in corrosion and other electric failures. In one embodiment, dust guard 108 is coupled to circuit board 102 utilizing any adhesive known in the art. In another embodiment, dust guard 108 is coupled to circuit board 102 utilizing clip attachments that run through circuit board 102 (i.e., through-hole mount). In yet another embodiment, dust guard 108 is soldered to circuit board 102.

In one embodiment, two or more circuit boards 102 are arranged in parallel in a stacked manner. A cooling fan introduces air onto the two or more circuit board 102 on inlet side 104 and exhausted on outlet side 106. Dust guard 108 located on inlet side 104 on each of the two or more circuit boards arranged in parallel, prevents particles from being built up on electronic components on each of the two or more circuit boards. In another embodiment, circuit board 102 is located in an enclosure. The enclosure acts as a conduit for passing cooling air from inlet side 104 of circuit board 102 to outlet side 106, where the cooling air is exhausted out of the enclosure.

Figure 2:
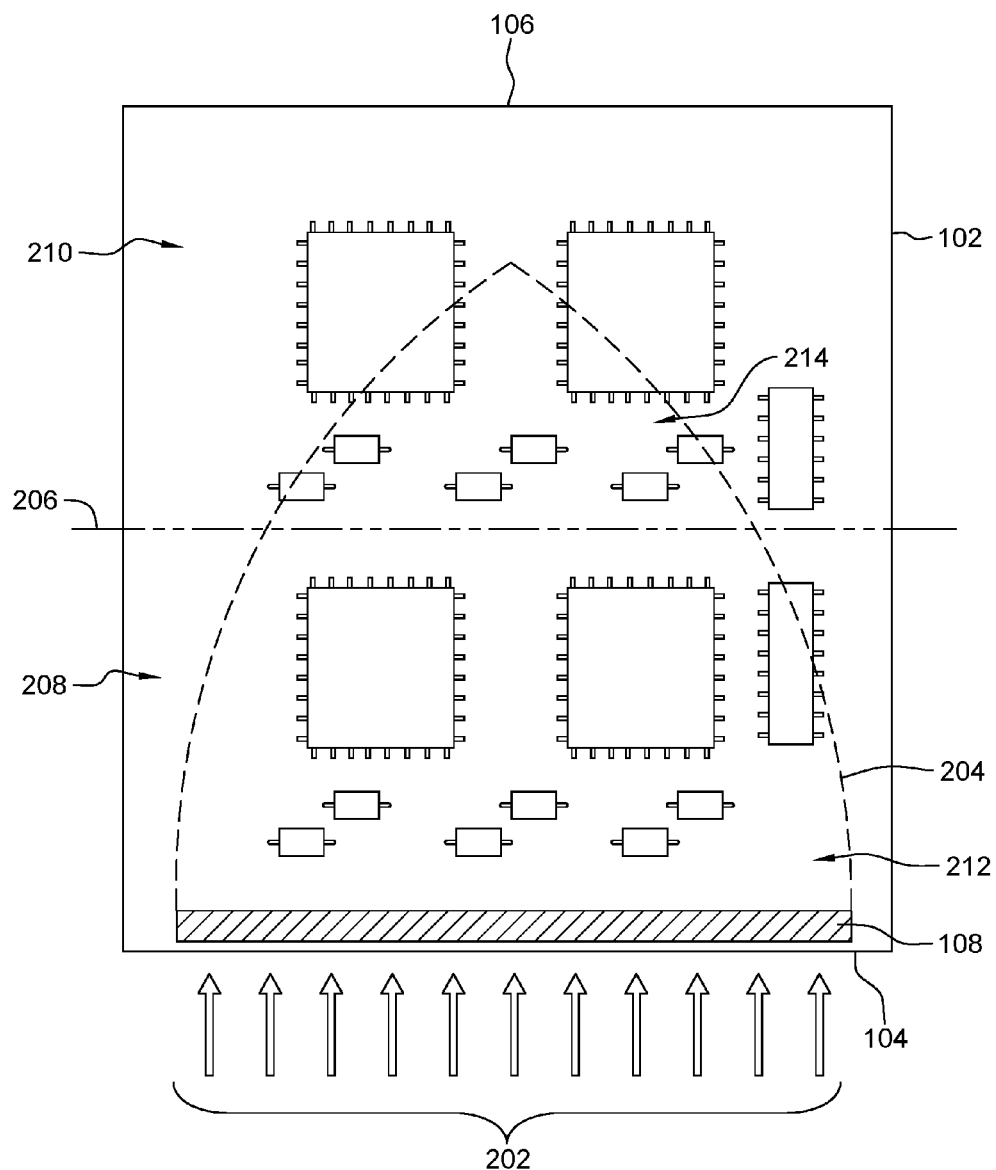
FIG. 2 depicts a top view of the circuit board with dust guard structure of FIG. 1, in accordance with one embodiment of the present invention.

FIG. 2 depicts a top view of the circuit board with dust guard structure of FIG. 1, in accordance with one embodiment of the present invention.

In this embodiment, cooling airflow 202 is being introduced to inlet side 104 of circuit board 106, from FIG. 1. Outline 204 represents an example air streamline created by cooling airflow 202 over circuit board 106, where dust guard 108 creates the example streamline shown by outline 204.

The location of outline 204 is dependent on an airflow rate of cooling airflow 202 and dimensions of dust guard 108. Dust guard 108, outline 204, and centerline 206 enclose to form area 212 on portion 208 of circuit board 102, where area 212 represents an area of reduced airflow. The height of area 212 is greatest near dust guard 108 and progressively decreases towards centerline 206 of circuit board 104. Outline 204 and centerline 206 enclose to form area 214 on portion 210 of circuit board 102.

Portion 210 of circuit board 102 experience higher temperatures with lower relative humidity compared to portion 208 of circuit board 208. Higher temperature with lower relative humidity allows for contaminants to pass over electronic components located in portion 210 of circuit board 102, without the contaminants attaching to electronic components. Electronic components in area 214 of portion 210 experience stagnant airflow on a lower portion of the electronic components due to dust guard 108 and accelerated airflow (i.e., cooling airflow 202) on an upper portion of the electronic components. The stagnant airflow in area 214 allows higher temperatures and lower relative humidity for these electrical components. Components in area 212 experience lower temperatures and higher relative humidity. Dimensions of dust guard 108 including width, length, height, and shape are dependent on application parameters of dust guard 108 including circuit board dimensions, circuit board enclosure dimensions, circuit board electronic component dimensions, and airflow rate over the circuit board.

Figure 3A:
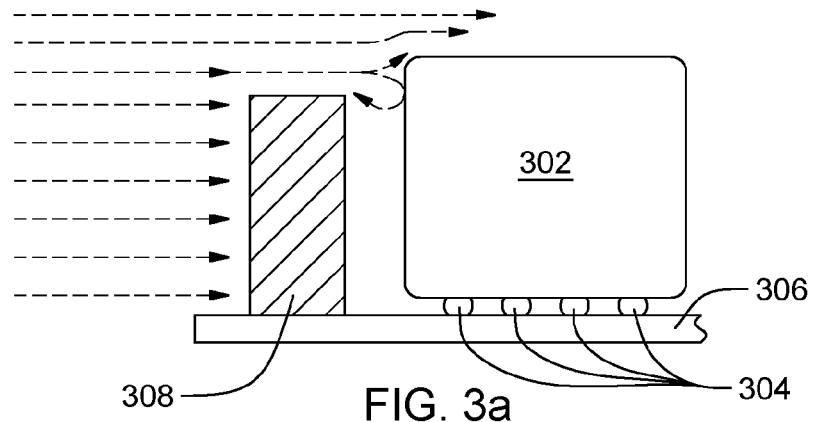
FIG. 3a depicts a side view of a block dust guard structure, in accordance with one embodiment of the present invention.

FIG. 3a depicts a side view of a block dust guard structure, in accordance with one embodiment of the present invention.

In this embodiment, electronic component 302 includes electrical connections 304 through which electronic component 302 connects to circuit board 306. Dust guard 308 located at an inlet side of circuit board 306 provides protection from contaminants coming into contact with electronic connections 304 of electronic component 302. In this embodiment, dust guard 308 is a block shaped dust guard structure stretching the width of the inlet side of circuit board 306. Dust guard 308 prevents particles (i.e., contaminates) from collecting on electronic connections 304 by diverting air away from electronic component 302 at the leading edge of the card. Cooing airflow passes over a top portion of electronic component to provide cooling and heat evacuation from electronic component 302, without introducing particles to electronic connections 304 located in a bottom portion of electronic component 302.

Figure 3B:
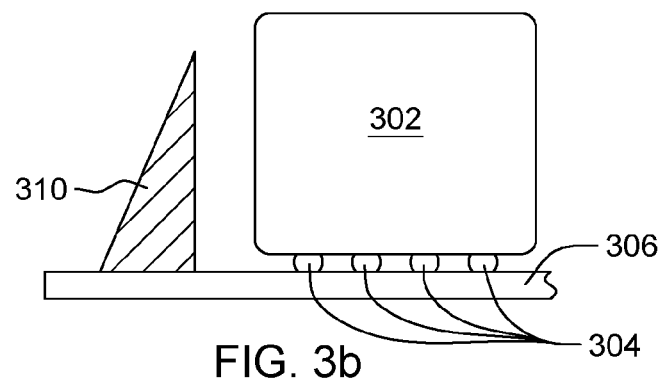
FIG. 3b depicts a side view of a wedge dust guard structure, in accordance with one embodiment of the present invention.

FIG. 3b depicts a side view of a wedge dust guard structure, in accordance with one embodiment of the present invention.

In this embodiment, dust guard 310 is a wedge shaped dust guard structure stretching the width of the inlet side of circuit board 306. Dust guard 310 prevents particles (i.e., contaminates) from collecting on electronic connections 304 by diverting air away from electronic component 302 at the leading edge of the card. Cooing airflow passes over a top portion of electronic component 302 to provide cooling and heat evacuation from electronic component 302, without introducing particles to electronic connections 304 located in a bottom portion of electronic component 302. In this embodiment, dust guard 310 includes a first surface and a second surface arranged in a manner to form an acute angle. The first surface and a top surface of circuit board 306 are arranged to form an acute angle, while the second surface and the top surface of circuit board 306 are arranged to form a right angle. In other embodiments, the first surface can include an adhesive film, a plurality of adhesive films stacked in arrangement, an abrasive coating, and/or an electrostatically charged film for collecting particles (i.e., contaminants).

Figure 3C:
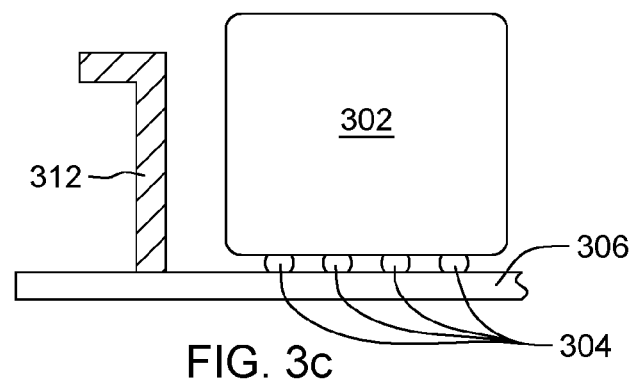
FIG. 3c depicts a side view of a partially enclosed dust guard structure, in accordance with one embodiment of the present invention.

FIG. 3c depicts a side view of a partially enclosed dust guard structure, in accordance with one embodiment of the present invention.

In this embodiment, dust guard 312 is a partially enclosed dust guard structure stretching the width of the inlet side of circuit board 306. Dust guard 312 prevents particles (i.e., contaminates) from collecting on electronic connections 304 by diverting air away from electronic component 302 at the leading edge of the card. Cooling airflow passes over a top portion of electronic component to provide cooling and heat evacuation from electronic component 302, without introducing particles to electronic connections 304 located in a bottom portion of electronic component 302. Dust guard 312 includes a first surface facing an inlet side of circuit board 306 and a second surface facing electronic component 302. A third surface of dust guard 312 extends over the first surface to create a partially enclosed area for collecting contaminants in dust guard 312. In other embodiments, the first surface can include an adhesive film, a plurality of adhesive films stacked in arrangement, an abrasive coating, and/or an electrostatically charged film for collecting particles (i.e., contaminants).

Figure 4:
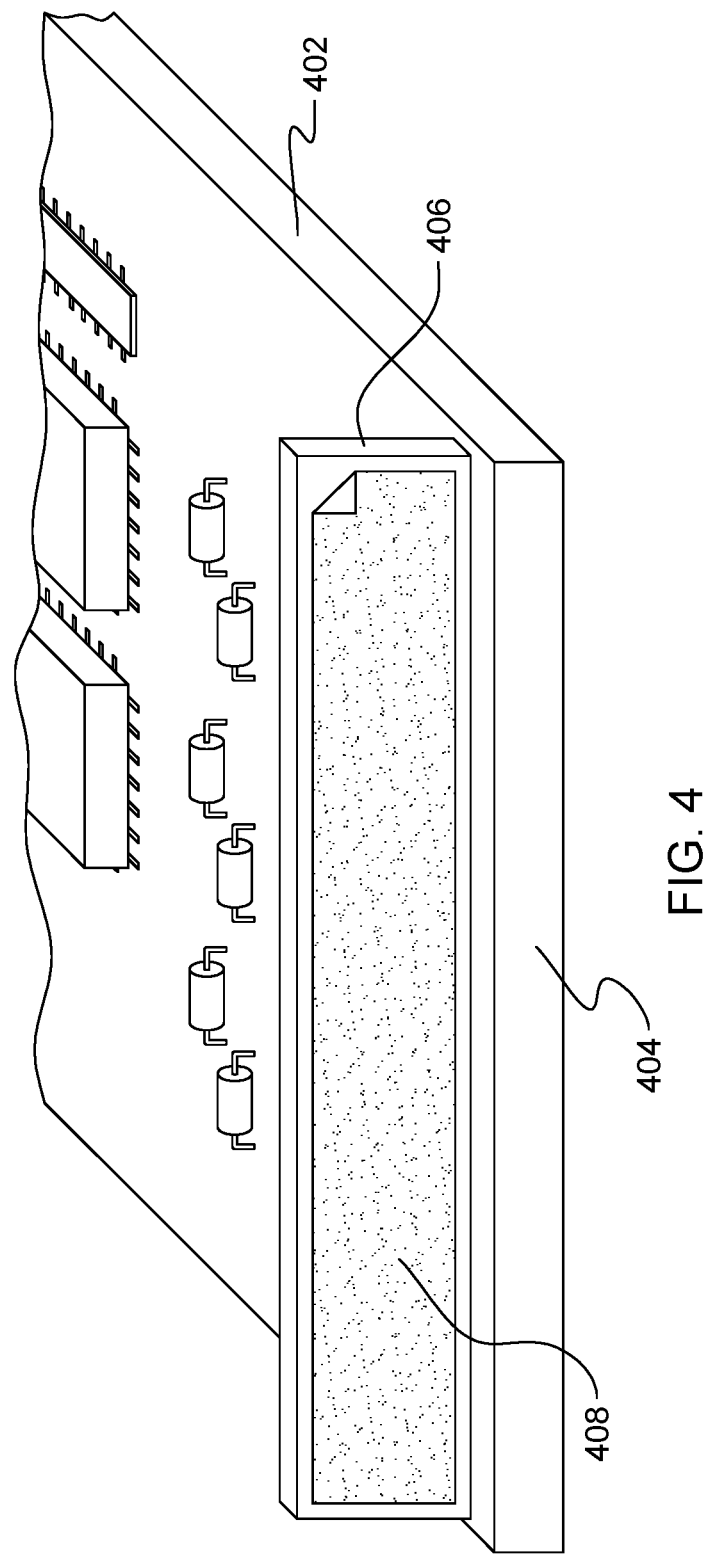
FIG. 4 depicts a block dust guard structure with an adhesive film, in accordance with one embodiment of the present invention.

FIG. 4 depicts a block dust guard structure with an adhesive film, in accordance with one embodiment of the present invention.

In this embodiment, circuit board 402 includes dust guard 406 coupled to inlet side 404 of circuit board 402. Dust guard 406 further includes film 408 for capturing particles (i.e., contaminants), that otherwise would be diverted by dust guard 406. In this embodiment, film 408 is a removable double-sided adhesive film that captures particles prior to the particles being diverted past the electronic components on circuit board 402. The removable double-sided adhesive film allows for a replacement film 408 to be re-applied in pre-determined service intervals. In another embodiment, film 408 is one of a plurality (e.g., 20) of removable single-sided or double-sided adhesive films arranged in a stacked manner. As film 408 collects particles over a period of time, film 408 along with any attached particles is removed exposing another film stacked below film 408. The plurality of stacked films allows for quicker servicing of dust guard 406 and shorter down time of circuit board 402.

In yet another embodiment, film 408 includes an abrasive coating (i.e., rough surface) to allow film 408 on dust guard 406 to capture particles. The abrasive coating includes a plurality of abrasive grains in which film 408 on dust guard 406 can capture corrosive particles (e.g., dust). The abrasive grains on the abrasive coating allow for the particle to remain on the surface of film 408 on dust guard 406, regardless of the cooling airflow rate that circuit board 402 experiences. In yet another embodiment, film 408 includes an electrostatic charge capable of attracting contaminates, such as dust particles. In this embodiment, film 408 is one of a plurality of removable electrostatically charged films that are serviceable dependent on the duration that each film holds the electrostatic charge. As a film (e.g., film 408) on dust guard 406 losses an electrostatic charge capable of attracting particles, the film reaches a servicing point and the film can be removed to expose a new electrostatically charged film.

Figure 5:
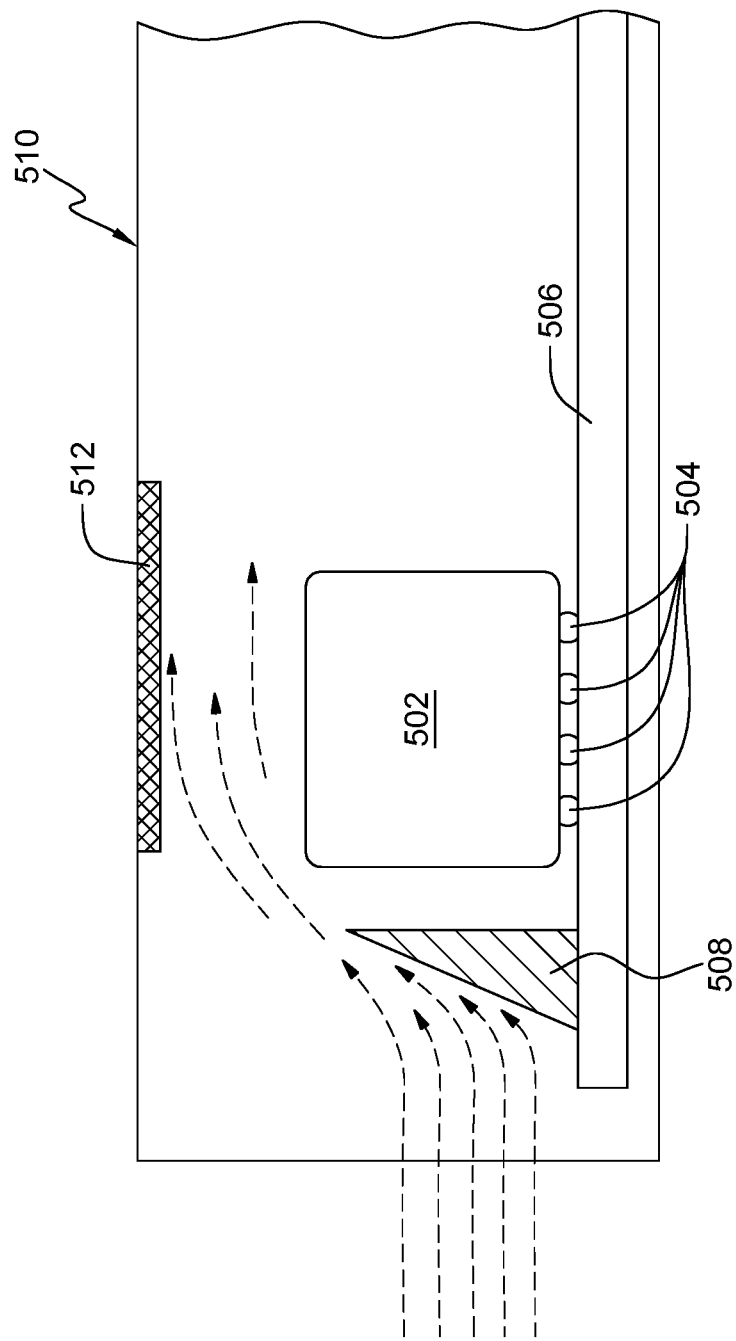
FIG. 5 depicts a wedge dust guard structure with an adhesive film mounted on a surface of a circuit board enclosure, in accordance with one embodiment of the present invention.

FIG. 5 depicts a wedge dust guard structure with an adhesive film mounted on a surface of a circuit board enclosure, in accordance with one embodiment of the present invention.

In this embodiment, electronic component 502 includes electrical connections 504 through which electronic component 502 connects to circuit board 506. Circuit board 506 is located in enclosure 510, where enclosure 510 is one of a plurality of enclosure located, for example, on a computer server rack. In this embodiment, enclosure 510 includes a plurality of apertures on an inlet side of circuit board 506 to allow cooling airflow to enter enclosure 510. Enclosure 510 also includes a plurality of apertures on an outlet side of circuit board 506 to exhaust the cooling airflow out of enclosure 510. In other embodiment, enclosure 510 can included a plurality of apertures on any side to maximize the effectiveness of the cooling airflow being introduced onto circuit board 506.

Dust guard 508 located at the inlet side of circuit board 506 provides protection from contaminants coming into contact with electronic connections 504 of electronic component 502 as the contaminants enter enclosure 510. In this embodiment, dust guard 508 is a wedge shaped dust guard structure stretching the width of the inlet side of circuit board 506. Dust guard 508 prevents particles (i.e., contaminates) from collecting on electronic connections 504 by diverting air away from electronic component 302 at the leading edge of the card. Particle trap 512 located inside enclosure 510 on a top portion of enclosure 510 captures contaminants diverted by dust guard 508. In this embodiment, particle trap 512 is a removable double-sided adhesive film that captures particles prior to the particles moving through enclosure 510 and onto other electronic components on circuit board 506. The removable double-sided adhesive film allows for a particle trap 512 to be re-applied in pre-determined service intervals.

In another embodiment, particle trap 512 is one of a plurality (e.g., 20) of removable single-sided or double-sided adhesive films arranged in a stacked manner. As particle trap 512 collects particles over a period of time, particle trap 512 along with any attached particles is removed exposing another film stacked below particle trap 512. The dimensions and shape of particle trap 512 is dependent on the dimensions and shape of dust guard 508, to maximize the effectiveness of particle trap 512. For example, altering an angle of the wedge shaped dust guard 508 alters a location to where containments are diverted by dust guard 508. The greater an angle of the wedge shaped dust guard 508, the closer particle dust guard 508 is located to the inlet side of circuit board 506. Reversely, the smaller an angle of the wedge shaped dust guard 508, the further particle dust guard 508 is located from the inlet side of circuit board 506.

In yet another embodiment, particle trap 512 includes an abrasive coating (i.e., rough surface) to allow particle trap 512 to capture particles diverted by dust guard 508. The abrasive coating includes a plurality of abrasive grains in which particle trap 512 can capture corrosive particles (e.g., dust). In this embodiment, particle trap 512 utilizes an adhesive back portion for coupling to an inner surface of enclosure 510 and the abrasive coating on the top portion for capturing the particles diverted by dust guard 508.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a dust guard structure (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for a dust guard structure, the apparatus comprising:
   a particle guard soldered to a top surface of a circuit board, wherein the particle guard is wedged shaped and extends at least a portion of a first side of the circuit board between a second side of the circuit board to a third side of the circuit board, wherein the first side of the circuit board is introduced to an external airflow;
   a first electronic component electrically coupled to the circuit board via one or more electrical connections, wherein a height of the particle guard is greater than a height of each of the one or more electrical connections of the first electronic component, wherein the particle guard is located along the first side of the circuit board between an edge of the circuit board and the first electronic component;
   a first surface of the particle guard positioned perpendicular to the top surface of the circuit board, wherein the first surface of the particle guard faces the circuit board;
   a second surface of the particle guard positioned at an acute angle with the top surface of the circuit board, wherein the second surface of the particle guard faces the external airflow;
   a plurality of adhesive films coupled to a first portion of the second surface of the particle guard, wherein the plurality of adhesive films are stacked in arrangement and each adhesive film of the plurality of adhesive films is individually removable;
   an abrasive coating positioned on a second portion of the second surface of the particle guard, wherein the abrasive coating includes a plurality of abrasive grains;
   a plurality of removable electrostatically charged films coupled to a third portion of the second surface of the particle guard, wherein each electrostatically charged film is individually removable; and
   an enclosure for the circuit board, wherein the enclosure includes:
      one or more apertures on a first surface of the enclosure where the first side of the circuit board is introduced to the external airflow;
      one or more apertures on a second surface of the enclosure opposite the first surface of the enclosure for exhausting the external airflow introduced at the first side of the circuit board; and
      a particle trap coupled to a third surface of the enclosure opposite the top surface of the circuit board such that the particle guard diverts the external airflow towards the particle trap, wherein a first adhesive film is coupled to a first surface of the particle trap opposite the top surface of the circuit board.

* * * * *